United States Patent [19]

Garcia

[11] Patent Number: 5,010,585
[45] Date of Patent: Apr. 23, 1991

[54] DIGITAL DATA AND ANALOG RADIO FREQUENCY TRANSMITTER

[76] Inventor: Rafael A. Garcia, P.O. Box 530153, Miami Shores, Fla. 33153

[21] Appl. No.: 531,587

[22] Filed: Jun. 1, 1990

[51] Int. Cl.$^5$ .................. H04B 1/04; H04L 27/12
[52] U.S. Cl. ...................... 455/118; 375/62; 332/100
[58] Field of Search ............ 455/91, 103, 104, 111, 455/112, 116, 118, 120, 124, 314, 313, 42, 43; 375/62, 65; 332/100; 370/110.1, 111; 358/186

[56] References Cited

U.S. PATENT DOCUMENTS

| | | | |
|---|---|---|---|
| 4,461,013 | 7/1984 | Lese et al. | 375/65 |
| 4,481,489 | 11/1984 | Kurby | 332/19 |
| 4,486,846 | 12/1984 | McCallister et al. | 364/607 |
| 4,682,123 | 7/1987 | Loper et al. | 332/16 R |
| 4,682,344 | 7/1987 | Somer | 375/62 |
| 4,746,880 | 5/1988 | McCune, Jr. | 332/16 R |
| 4,813,040 | 3/1989 | Futato | 370/111 |
| 4,912,773 | 3/1990 | Schiff | 455/71 |

OTHER PUBLICATIONS

Zavrel, Robert J., Jr., "Digital Modulation Using NCMO", RF Designs, Mar. 1988.
McCune, Earl W., Jr., "Digital Communications Using Direct Digital Synthens", RF Designs, Jan. 1990.

*Primary Examiner*—Reinhard J. Eisenzopf
*Assistant Examiner*—Chi H. Pham

[57] ABSTRACT

A digital Non Return to Zero (NRZ) and Frequency Modulated (FM) radio transmitter intended but not unique to, for the transmission of Digital, Tone Only or Tone and Voice paging messages is described. This transmitter is built on the concept that the separate signals required are individually constructed, and then combined together into the actual RF output. This provides for optimized circuitry for each particular function for the highest performance. There is no reason for compromising the performance of a particular function, and the implementation of the modulation and synthesis with direct digital technology provides extremely linear and fast radio performance at no extra cost. Maintenance is also simplified since the individual blocks can be troubleshooted and repaired (or replaced) requiring a minimum of down time.

11 Claims, 6 Drawing Sheets

DIGITAL DATA AND ANALOG RADIO FREQUENCY TRANSMITTER

BACKGROUND OF THE INVENTION

This invention relates but is not unique to the field of radio paging and alarm simulcast transmission systems using Digital Data, Tone Only or Tone and Voice formats. To accomplish this, the invention uses direct numeric synthesis technology which digitally modulates radio signals with the desired numeric information, therefore data or voice transmission systems can now be built with unprecedented accuracy, simplicity and economic performance. Numeric signal synthesis technology solves many problems like modulation accuracy, variable data rate intolerance as well as bandwidth control by using signal shaping techniques.

The contributions of the Number Controlled Modulated Oscillator (NCMO) in the communications and surveillance fields are many, and its contribution to this data communications system design due to its precision signals has permitted the application of numeric syntheses technology to these communications formats. Another of the most desirable features of the present invention is the high speed capabilities of its transmission.

SUMMARY OF THE INVENTION

In short description of FIG. 2 the present invention involves a Digital (202) and Analog (201) Modulator intended but not unique for the radio transmission of Digital Data (FSK) and Analog Information (Voice or Tones) to radio receivers (Pagers). The present invention is built in modular form. Its circuitry is described in eight basic blocks as follows:

I. Modulating Controller (201-202-203)
II. RF Modulator (214)
III. Tuning Synthesizer (225)
IV. Baseband Combiner (246-249)
V. VHF Upconversion (256-257-259)
VI. UHF Upconversion (268-269-271)
VII Reference Frequency (242)
VIII. RF Power Amplifier (280)

Clarification of Design Scope

The radio frequencies used of the description of the operation of the circuitry for this invention as well as the conversions and frequency bands on this sample application, are not necessarily limiting the scope of the invention but help to better explain the operation and concept of the invention. Each block is individually described below An additional block "VI" is required for the UHF upconversion when transmitting on the 450 and 900 MHz. frequency ranges. This block "VI" will be identical to block "V" except for the operating frequency of the Voltage Controlled Oscillator (VCO) and the turning of the filters.

Due to the experience of "Digital RF Solutions" on the field of Numerically Controlled Modulated Oscillators (NCMO), their services were contracted to design and build for us a prototype following the parameters of our invention. These parameters are on the field of Data information transmission by means of modulating an RF Transmitter using non return to zero (NRZ) Frequency Shift Keying (FSK) with an independent (Negative and Positive) deviation control and to also be capable for the transmission of Analog Modulation (FM).

Some of the circuits on our design use integrated components of existing circuits manufactured by Digital RF Solutions. Application Notes (AN-XXXX) and technical specifications are included with our presentation, as well as complete detailed information on the circuitry of the invention. For simplification, not shown are the programmable Read Only Memory (PROM) circuitry that remotely selects the synthesizer frequency for each band segment.

DETAILED DESCRIPTION OF THE PREFERRED EMBODIMENTS

Figure 1:
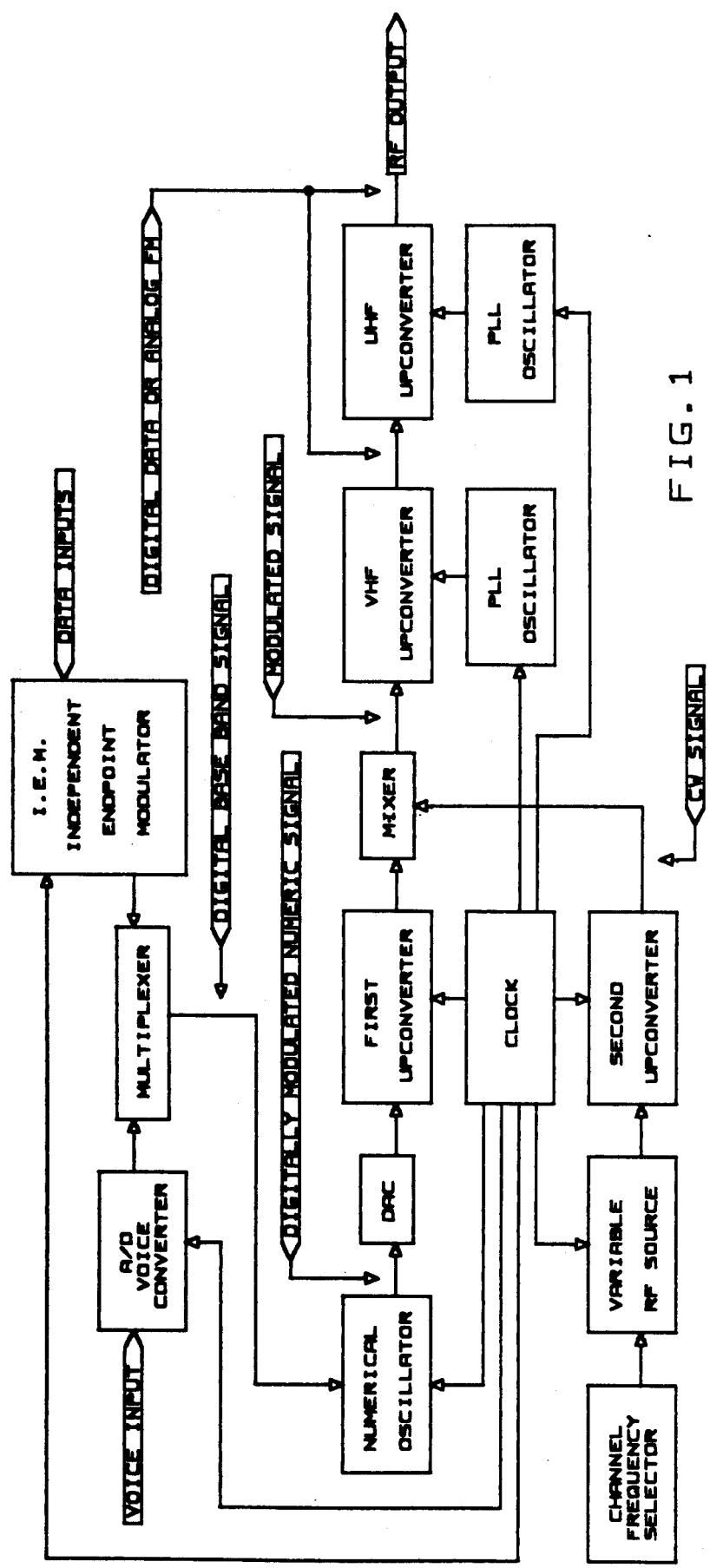
FIG. 1 is a Simplify block diagram of the Digital Data and Analog Radio Frequency Transmitter.

Modulation capability and control are two of the most visible advances with this design. All of the modulation circuitry is completely digital after the voice input amplifier in FIG. 2 and analog-to-digital (A/D) converter (201). Digital FSK modulation is directly 'calculated' in the modulator (214), based on the incoming data stream (215). There are no PLLs in the signal path to distort a data stream with an unbalanced number of zeros and ones. The direct digital modulation can be offset a fixed amount indefinitely, keeping the full accuracy of the station reference oscillator (242).

Voice modulation is zero centered on the carrier. This means that when the transmitter is set for voice modulation (204), the carrier is on the center of the channel until a voice waveform (205) is present. The voice waveform then symmetrically frequency modulates the carrier about channel center. Distortion of the voice modulation is under 1% due to the inherent linearity of the digital process.

One unusual feature of the digitally implemented voice modulation is that overdeviation is now impossible. Since the A/D converter (201) can only cut out numbers between zero and 255, this is all that is available to modulate the transmitter. By setting the numeric modulator (214) to not overdeviate with full scale numbers from the A/D converter (201), overdeviation is now impossible.

The fully numeric data modulation also has several unique features. Without the need for phaselock loops, there is also no need for the complexity of DC restoration, switched multiple loops, skewed crystal references, and/or other means used to keep the carrier frequency accurate during modulation by asymmetrical data waveform. The numeric modulator (214) keeps full station reference frequency accuracy at all times, and at all output frequencies.

With this independence of the output signal accuracy from all output modulated waveforms, additional features are available. In particular, the positive and negative deviations of the carrier are completely independent of each other. On FIG. 4 Switches (406) are used to set the positive deviation to anywhere from zero to 5 kHz with better than 100 Hz resolution. Another set of switches (407) sets the negative frequency deviation over the same range and resolution. As the data stream varies between zero and one, and back again, the numeric modulator (214) in FIG. 2 steps between these two deviation limits. This is referred to as Independent Endpoint Modulation (IEM) (202).

The IEM (202) technique also controls the rate at which the output RF carrier is switched from one deviation endpoint to the other. This allows the deviation switching rate to be slowed down for lower spectrum occupancy if necessary. At full speed the IEM supports over 2,400 baud with 8 kHz of total FSK deviation.

The Fundamental Mathematics of This Design

On the following example the design combines three signals in four steps to build the final modulated VMF output signal, this process can be described with the following equation;

$$fo = fm + ft + fv + 2fclk \qquad \text{Equation \#1}$$

where:
fo (259) is the output frequency (152.00–153.00 MHz)
fm (231) is the numeric modulator output frequency (3.125000 MHz)
ft (241) is the output frequency of the tuning DDS (1.8–2.8 MHz)
fv (256) is the VHF upconversion LO frequency (127.00000 MHz)
fclk (242) is the station reference frequency (10.000000 MHz)

Equation #1 shows that all the block frequencies do add to the final output, and so are relatively independent. This means that what happens on one of the block frequencies directly affect the output, but has no affect at all on any of the other block frequencies. This is very important, and is a major reason that this approach achieves its high performance.

The most important result from Equation #1 is that the single PLL (256) in the VHF Upconversion (fv) is completely independent of any and all modulation developed by the RF Modulator (fm) (231). The PLL (256) is also independent of the Tuning Synthesizer (225) (ft) (241), which sets the transmitter tuning resolution. The PLL (256) can therefore be independently optimized for low noise, with no compromise for output tuning resolution requirements or linearity and bandwidth needs for accurate modulation.

By substitution of the NCMO (214) tuning relations (see AN1002, NCMO fundamentals) for fm (231) and ft (241) in equation #1, and also including the PLL (256) multiplication relation, get the relationship between the output frequency (231) and the system reference oscillator (242).

$$fo = \left( \frac{M}{2 \cdot 24} + \frac{T}{10 \cdot 7} + \frac{127}{10} + 2 \right) \cdot fclk \qquad \text{Equation \#2}$$

where:
M is the modulation number (216) from the IEM (202)
T is the tuning number (226) to Tuning Synthesizer (225)
127/10 represents the PLL (256)
This equation shows that the output (259) is always direct multiple of the station reference (fclk) (242). This proves that this transmitter design is completely locked to this station reference (242), which controls the long term stability of the station. Since the only variables "M" (216) and "T" (226) are integers and are usually set by switches, there is no tendency for drift in this design.

INDIVIDUAL BLOCK DESCRIPTIONS

I. Modulation Controller

This description of the Independent Endpoint Modulator (IEM) and A/D Conversion refers to the included FIGS. #3 and #4. The circuitry of the A/D voice converter in FIG. #3 takes the audio signal from a microphone connected at J1 (308), amplifies it (310), digitizes it (311) and synchronizes (312) it to the system clock (342) and inverts the Most Significant Bit (MSB) (314). The result is then presented to the multiplexer (313). An internal clock (417) on the (IEM) FIG. #4 is generated from the 10 MHz system reference clock (242) in FIG. 2 using the circuitry of U1, U2, U3, RN1 and J2. This clock controls the transition time of the FSK in the directions between the negative and positive data deviation limits. The frequency of this clock is set by selectively shorting opposing pins (418) of J2 together. The frequency of this internal clock is governed by the equations:

$$fclk = fref/2(N+2) \text{ For } N>0$$

$$fclk = 5MHz \text{ For } N=0$$

(N is the binary number at J2) (418) in FIG. #4
The positive deviation limit is set in FIG. #4 by the circuitry of U4, U5, RN2, and S1. Knowing that for S1 (406) position 1 is the Least Significant Bit (LSB) and the maximum positive deviation from the carrier frequency can then be set by referring to the deviation/bit setting table in Appendix A.
1 = numbered edge of switch UP
0 = numbered edge of switch DOWM The negative deviation limit is set on FIG. #4 by the circuitry of U12, U13, RN3, and S2 (407). The S1 (406) position information above also applies to S2 (407). The maximum negative deviation may also be set by referring to the deviation/bit setting table provided in Appendix A.

A counter is formed in FIG. #4 by the ICs U10 and U11. This counter will count up until the upper limit is reached if U9C pin 8 is HIGH and U9A pin 12 is clocked. It will count down until the lower limit is reached if U9A pin 12 is HIGH and U9C pin 8 is clocked. The circuitry of U6, U7, and U9 is designed to tell the counter when to stop counting, when to count and in which direction.

As the state of the incoming data stream enters into the counter's logic equation, provisions have been made to assure that the proper polarity is presented to the logic gates at the proper time. This is accomplished in FIG. #4 by J4 (409) and UBA. If the incoming data stream is DATA then the two top pins of J4 (409) should be shorted together. If the stream is NOT DATA (data stream is inverted) then the lower two pins should be shorted together. U8A synchronizes the DATA transitions to the IEM.

Figure 5:
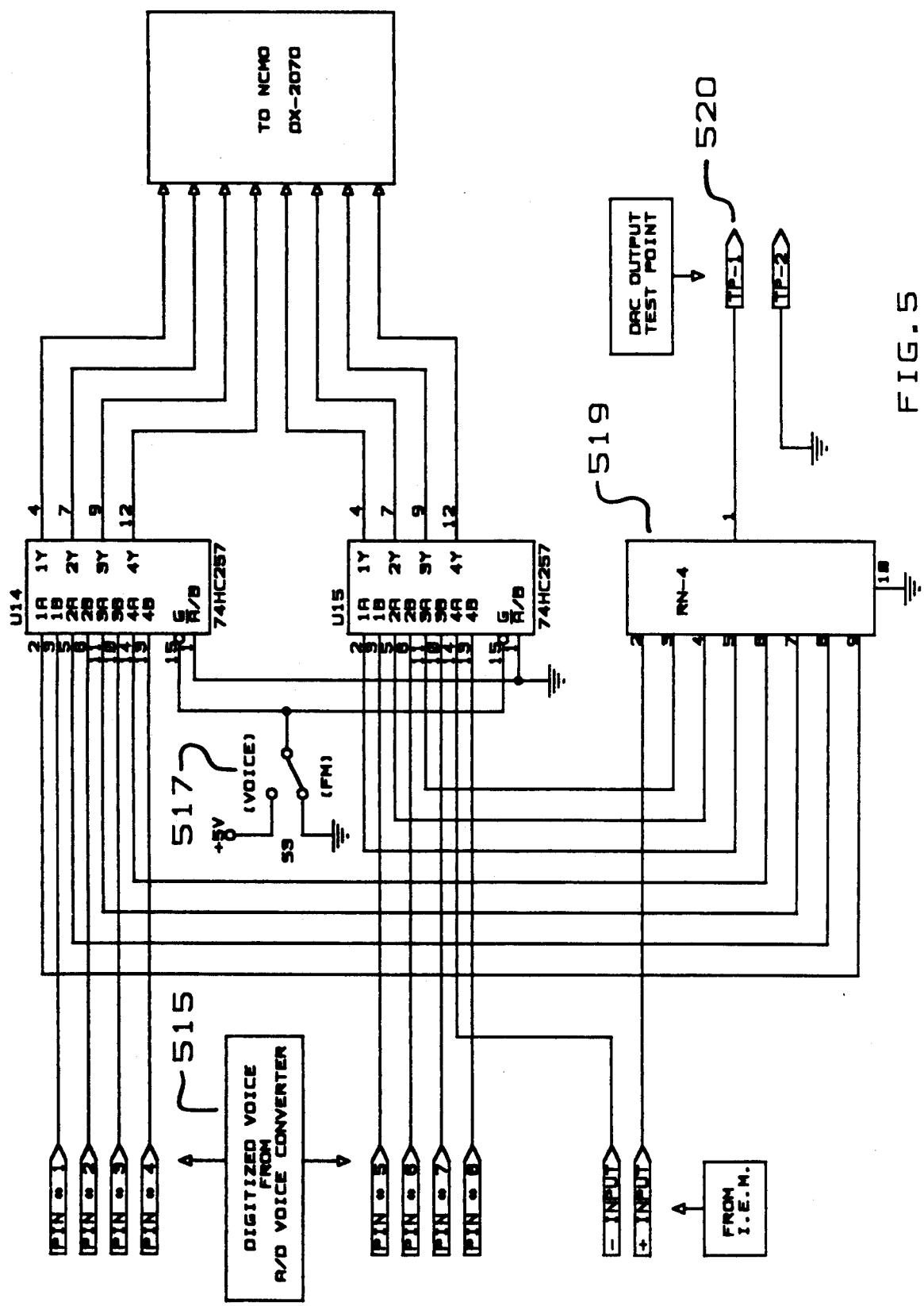
FIG. 5 is a detailed electrical schematic of the multiplexer.

The output bits of the counter, besides being used to see if the upper or lower limit has been reached also go to the multiplexer FIG. #5. The multiplexer on FIG. 5 is formed by ICs U14 and U15. The other inputs to this device are digitized "voice" (515) from the A/D voice converter (201) in FIG. 2. Switch S3 (517) determines whether it is the voice or counter inputs that are sent on to the modulation port of numerical oscillator modulator (214) in FIG. 2.

The final bit of IEM circuitry is a simple resistive Digital/Analog Converter (DAC) (519) in FIG. 5. Its function is to make trouble shooting of IEM (202) in FIG. 2 easier. On FIG. #5 the DAC output (520) will generate "trapeziods" when displayed on an oscilloscope with the DATA stream if everything is functioning smoothly.

When DATA goes high the DAC (520), output will increase linearly until the upper modulation limit is reached and will remain at the final level until DATA goes low. When DATA goes low the DAC output (520) will decrease linearly until the lower modulation limit is reached and will remain at that level until DATA goes high. The process then repeats itself. Jitter on the DAC output is an indication of race conditions in the counter's logic circuitry.

Figure 2:
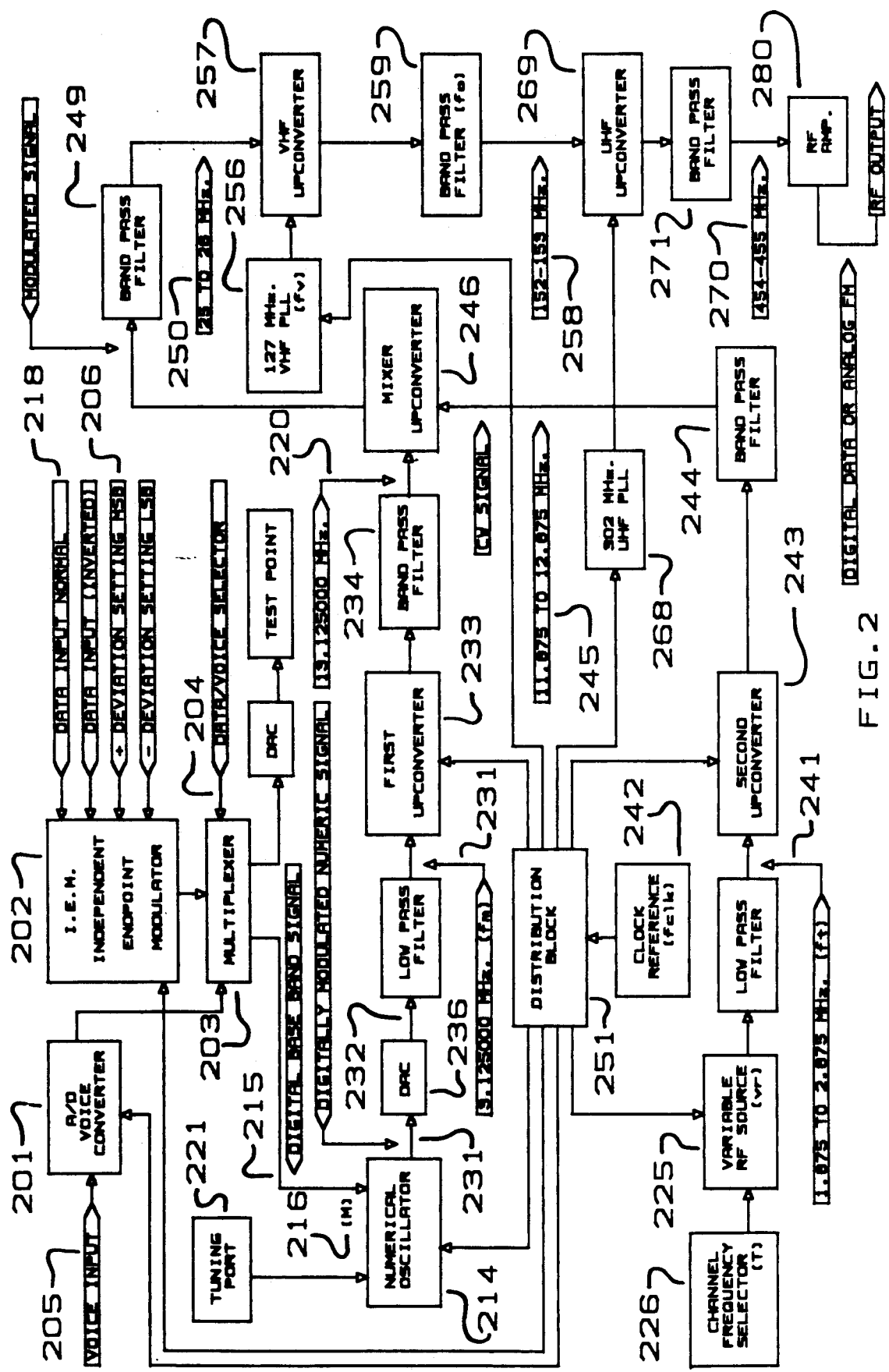
FIG. 2 is a detailed block diagram of the Digital Data and Analog Radio Frequency Transmitter.
Figure 3:
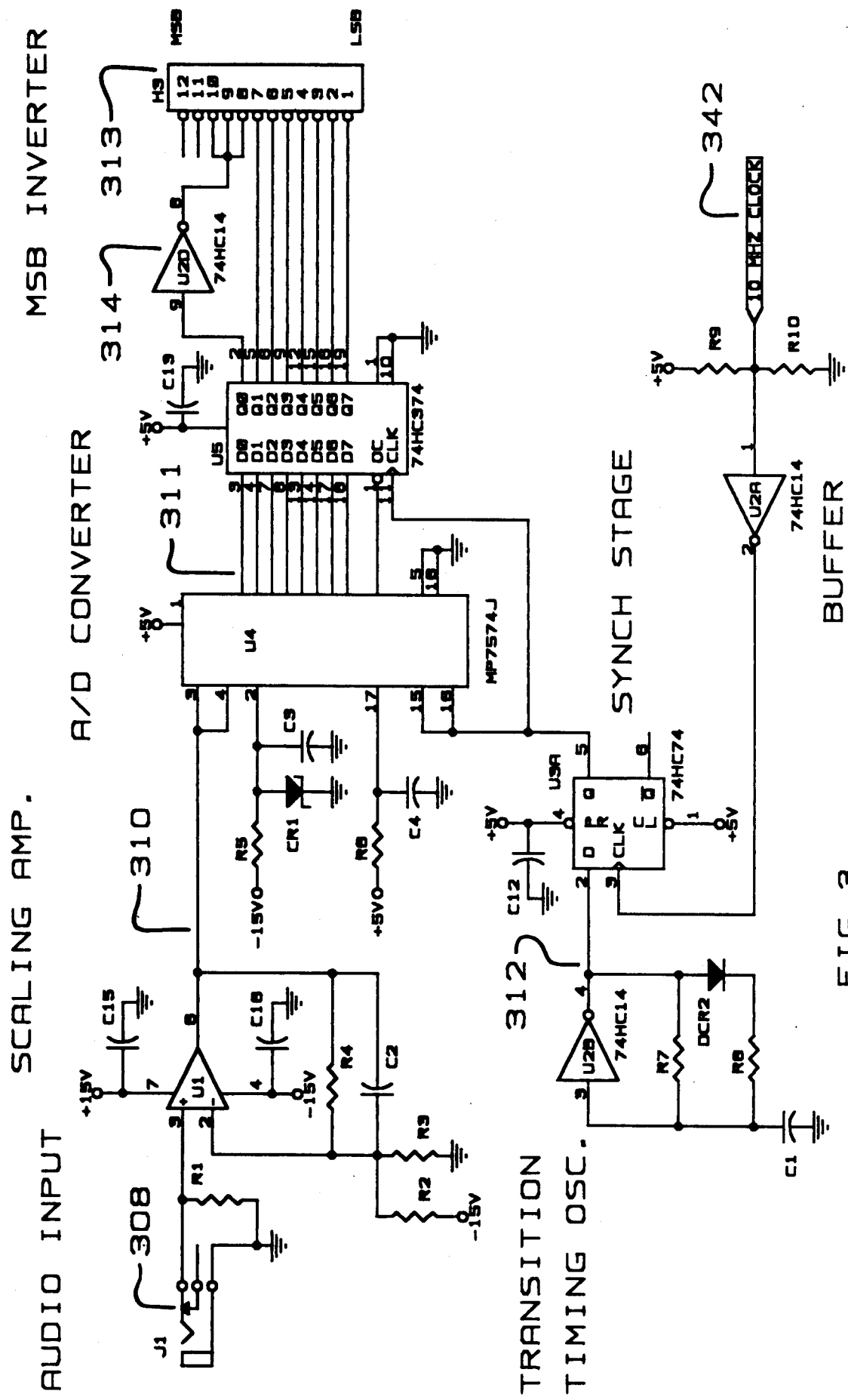
FIG. 3 is a detailed electrical schematic of the audio processor and and analog to digital converter.
Figure 4:
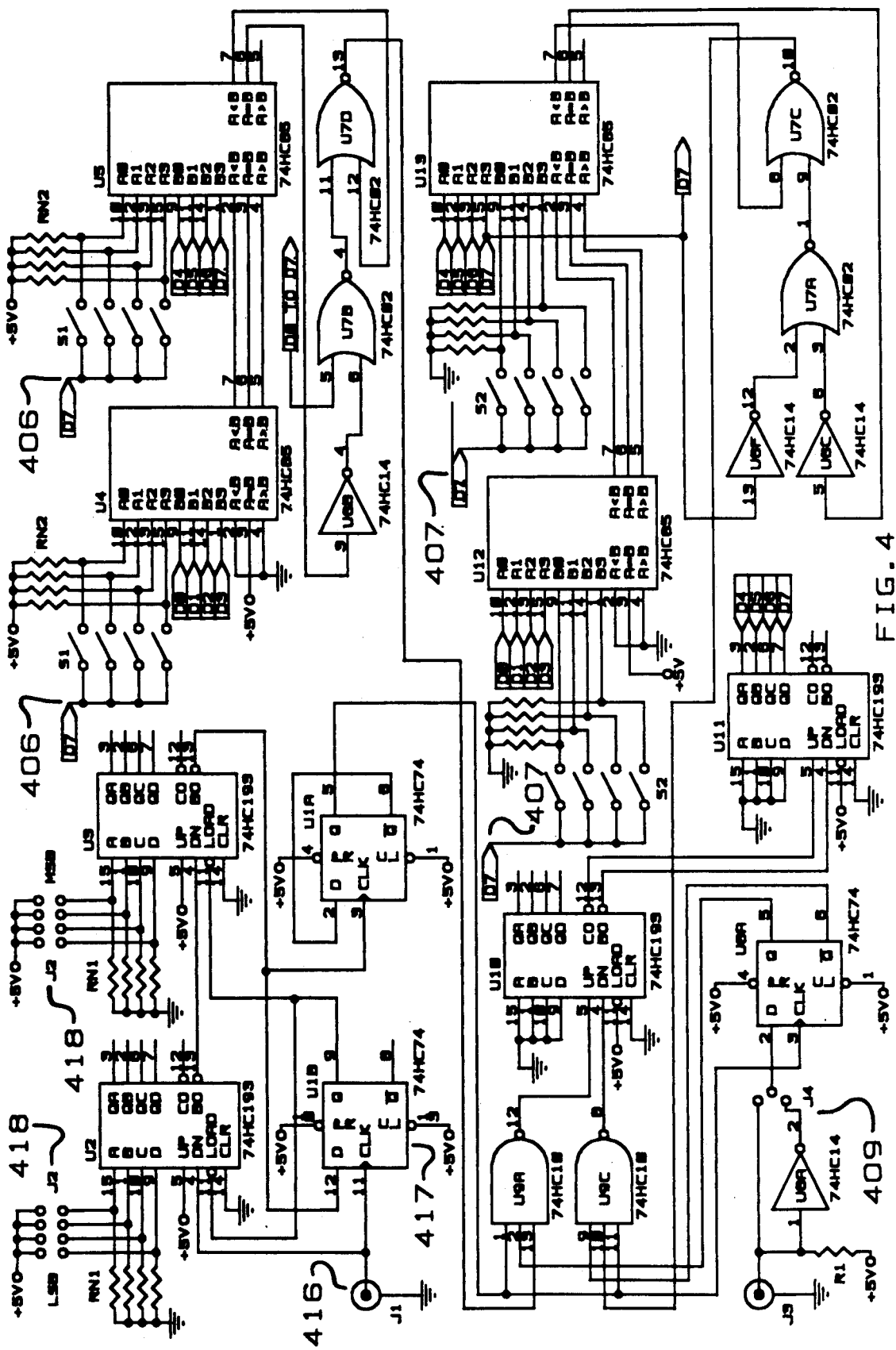
FIG. 4 is a detailed electrical schematic of the IEM controller.

It is possible to put the IEM (202) in FIG. 2 into an illegal mode of operation if the relationship between the data baud rate, (218) total amount of deviation requested (206) and internal clock (242) are violated. In other words, if the transition clock is too slow, not enough time is available to complete the data transition before the input data changes, and the modulator will never reach the intended deviation limit. If this occurs the DAC output (520) in FIG. 6 will generate triangles at best. The relationship that needs to be maintained is:

$$N < [23843.8 / (\text{total deviation}) (\text{baud rate})] - 2.$$

where N is the number at J2 (418) in FIG. 4.

II. RF Modulator

This block takes the numeric modulation from the modulation Control block (215) on FIG. 2 and digitally synthesizes a properly modulated signal centered at 13.125 MHz. (220).

For the purpose of this description on FIG. #2 the NCMO's turning port (221) on the NCMO modulator (214) has been set for 5/16 of the system clock (242), (all bits except the 2nd and 4th MSBs have been grounded). This yields a carrier frequency of 3.125000 MHz. (281) from the 10.000000 MHz. station reference (242). To this tuning number the NCMO (214) adds the frequency modulation numbers provided by the IEM (202). The numeric synthesis is then completed with the waveform map and digital-to-analog converter (DAC) (236).

From the DAC (236) in FIG. 2, the 3.125000 MHz modulated signal is in analog form (232). The DAC waveform is lowpass filtered (231) to remove all sampling mixing products. This modulated sinewave is then upconverted (233) with the 10 MHz system clock (242) and then filtered again (234) to yield the 13.125000 MHz. sum component (220).

III. Tuning Synthesizer

This block (226) on FIG. #2 provides for the tuning of the transmitter output signal over a 1.0 MHz bandwidth. This is achieved by generating of a unmodulated signal covering between 11.875 and 12.875 MHz. (245).

On this example of FIG. #2 the NCMO (225) has had all the bits of its tuning port (226) grounded (tuned for 0Hz). The bank of switches attached to the modulation port are what generate the output frequency in this instance. By limiting the switch settings to those between 00110000000000000000000 (1.875000 MHz)

and 01001001100110011010 (2.875000 MHz)

only signals between 11.875 MHz and 12.875 MHz will be generated (245) when upconverted (243) with the 10 MHz system clock (242) and filtered again (244). After the output bandpass filter (244) this signal drives a diode ring mixer (246).

On Appendix A a NCMO tuning word "calculator" has been included in the documentation to show the actual settings of the prototype.

On FIG. #2 tuning (226) between 1.875000 MHz and 2.875000 MHz. (241) is done with 1.000000 Hz resolution. This synthesizer does not use a PLL but is another numeric synthesizer operating from the station 10 MHz reference (242) using the VR(tm) technique from "Digital RF Solutions Corp". Using the numeric synthesis VR (225) technique provides this very fine resolution with no degradation in phase noise from the reference signal.

In FIG. 2 the previously generated modulated 13.125 MHz signal (220) and the tuning signal between 11.875 and 12.875 MHz (246) are upconverted (246), and filtered (249) to select the sum component. The result is a modulated signal between 25 and 26 MHz (250).

IV. Baseband Combiner

The Baseband Combiner (246-249) in FIG. 2 provides at output signal that is both properly modulated and tunable over a 1 MHz bandwidth. This signal is provided over 25.0-26.0 MHz.

V. VHF Upconversion

The VMF Upconversion Block on FIG. 2 synthesizes a fixed 127 MHz LO using a phase Locked Loop (PLL) (256), and upconverts the combined baseband (267) with it to provide the RF output frequency of 152.0 to 153.0 MHz. (258). A Band Pass filter (259) conditions the VHF RF output between 152 and 159 MHz.

Figure 6:
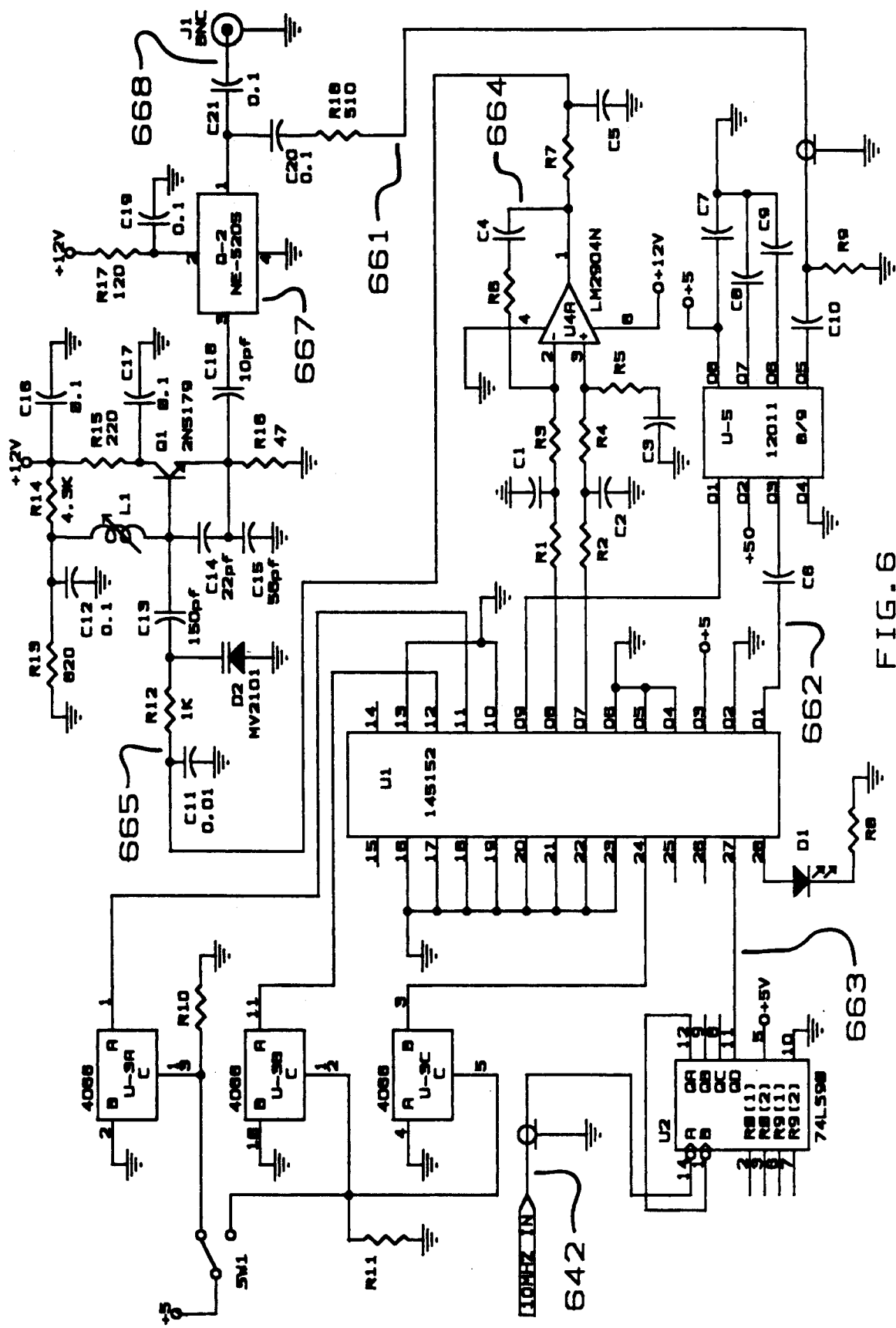
FIG. 6 is a detailed electrical schematic of the synthesizer and Voltage Controlled Oscillator (VCO).

FIG. 6 shows the circuitry for the 127 MHz LO generated with a PLL. The VCO is a simple colpitts oscillator operating with a 2N5179 UHF transistor and a MV2103 (657) varactor. Output isolation is achieved with a Signetics NE5205 (668) wideband 20 dB amplifier.

FIG. #6 the PLL samples the VCO (661) output and divides its frequency by 8 with a MC12011 prescaler. This yields a 15.875 MHz (662) input to the 146152 PLL IC. The 10 MHz system reference (642) is divided by 10 (663), so that the 145152 operates from a 1.000 MHz reference. The 145152 divides the reference internally by 8 and the VCO by 127. The resulting 125 kHz signals are compared with a differential output phase-frequency comparator and output to the loop filter (664).

An active loop filter (664) on FIG. #6 gives a net phase error of zero degrees. Implemented as a type-2 third order loop, the time constants are set for a loop bandwidth of 2 kHz with a 60 degree phase margin for stability. The output voltage of this loop filler is fed to the VCO (665), correcting any error. The VCO output is buffered with an NE5205 (667) to a one milliwatt level (668).

The buffered VCO output (256) in FIG. #2 is sufficient to drive a diode ring mixer (257) to perform the upconversion. Mixing with the RF baseband and bandpass filtering (259) the sum component yields the output frequency (258).

VI. UMF Upconversion

When transmitting on the UMF frequency ranges of 450 MHz. or 900 MHz. an additional Upconvertion circuit (268-268-271) in FIG. #2 is used. This circuit is similar in principle to the one shown on the VMF upconversion module (256-257-259). On this example the UHF Upconversion Block synthesizes a fix 302 MHz. LO using a phase Looked Loop (PLL) (268), and mixes the combined baseband (269) with it to provide the final transmitter output frequency for the UMF band of 454-455 MHz. (270). A fix frequency 779 MHz. is used for the UHF band of 931-932 MHz.

VII Reference Frequency

On FIG. #2 the Reference Frequency block (242) provides for distribution of the 10.000000 MHz station reference (251) to the entire transmitter. On this example there are eight places where this reference is needed. It is recommended that a buffered sinewave be distributed among the different blocks. Squarewave conversion can be done internal to each module, as required, this avoids the transmission of the very wideband squarewave within the transmitter, which is subject to radiation and the resulting generation of spurious signals. Wideband squarewaves are generated and used only within their enclosed modules, where they are much more easily controlled.

The advantage of using a single clock reference oscillator does not preclude the possible use of individual signal sources for this invention.

APPENDIX A

| Deviation (Hz) | Bit Settings MSB    LSB | Deviation Error (Hz) | | Bit Weight |
|---|---|---|---|---|
| 5000 | 10000011 | −2.75 | | |
| 4900 | 10000000 | −17.59 | | |
| 4800 | 01111110 | 6.52 | | |
| 4700 | 01111011 | −7.92 | | |
| 4600 | 01111001 | 15.70 | | |
| 4500 | 01110110 | 1.34 | | |
| 4400 | 01110011 | −13.10 | | |
| 4300 | 01110001 | 10.60 | | |
| 4200 | 01101110 | −3.83 | | |
| 4100 | 01101011 | −18.27 | | |
| 4000 | 01101001 | 5.44 | | |
| 3900 | 01100110 | −9.01 | | |
| 3800 | 01100100 | 14.70 | | |
| 3700 | 01100001 | .26 | | |
| 3600 | 01011110 | −14.18 | | |
| 3500 | 01011100 | 9.53 | | |
| 3400 | 01011001 | −4.91 | | |
| 3300 | 01010111 | 18.79 | MSB = | 4882.81 Hz |
| 3200 | 01010100 | 4.35 | | 2441.41 |
| 3100 | 01010001 | −10.09 | | 1220.70 |
| 3000 | 01001111 | 13.62 | | 610.35 |
| 2900 | 01001100 | −.82 | | 305.18 |
| 2800 | 01001001 | −15.26 | | 152.59 |
| 2700 | 01000111 | 8.44 | | 76.29 |
| 2600 | 01000100 | −6.00 | LSB = | 38.15 |
| 2500 | 01000010 | 17.70 | | |
| 2400 | 00111111 | 3.26 | | |
| 2300 | 00111100 | −11.18 | | |
| 2200 | 00111010 | 12.52 | | |
| 2100 | 00110111 | −1.92 | | |
| 2000 | 00110100 | −16.36 | | |
| 1900 | 00110010 | 7.34 | | |
| 1800 | 00101111 | −7.09 | | |
| 1700 | 00101101 | 16.62 | | |
| 1600 | 00101010 | 2.47 | | |
| 1500 | 00100111 | −12.27 | | |

-continued
APPENDIX A

| Deviation (Hz) | Bit Settings MSB    LSB | Deviation Error (Hz) |
|---|---|---|
| 1400 | 00100101 | 11.44 |
| 1300 | 00100010 | −3.01 |
| 1200 | 00011111 | −17.44 |
| 1100 | 00011101 | 6.27 |
| 1000 | 00011010 | −8.18 |
| 900 | 00011000 | 15.53 |
| 800 | 00010101 | 1.09 |
| 700 | 00010010 | −13.36 |
| 600 | 00010000 | 10.35 |
| 500 | 00001101 | −4.08 |
| 400 | 00001010 | −18.53 |
| 300 | 00001000 | 5.18 |
| 200 | 00000101 | −9.26 |
| 100 | 00000011 | 14.44 |

What is claimed is:

1. An RF transmitter for transmitting either analog voice or digital data comprising:
   multiplexing means for switching between an analog voice input and digital data inputs to provide a selected signal, numerical oscillator means connected to the output of the multiplexing means for converting the selected signal to a digitally modulated numeric frequency signal,
   D/A conversion means connected to the output of the numerical oscillator means for converting the digitally modulated numeric frequency signal to an analog signal,
   first upconversion means connected to the output of the D/A conversion means for upconverting the analog signal to a first higher frequency signal,
   variable RF source means for providing a selected accurate preset frequency signal within a range of frequencies,
   second upconversion means connected to the output of the variable RF source means for upconverting the preset frequency signal to a second higher frequency signal,
   mixing means connected to the output of both the first and second upconversion means to provide a modulated signal,
   clock means connected to the numerical oscillator means, the variable RF source means and the first and second upconversion means for providing synchronization for each said means.

2. The RF transmitter of claim 1, further comprising:
   modulator means comprising an independent endpoint modulator connected between the digital data inputs and the multiplexer means for stabilizing the modulation limits for the numerical oscillator means for both the digital data and analog voice.

3. The RF transmitter of claim 1 wherein the numerical oscillator means produces digital FSK information 4. The RF transmitter of claim 1 further comprising:
   VHF upconversion means connected at the output of the mixer means for upconverting the modulated signal to a VHF signal.

5. The RF transmitter of claim 4, further comprising:
   UHF upconversion means connected to the output of the VHF upconversion means for upconverting VHF signal to a UMF signal.

6. The RF transmitter of claim 4 wherein the VHF signal is in the range of 150-174 MHz.

7. The RF transmitter of claim 5 wherein the UHF signal is in the range of 450-512 MHz.

8. The RF transmitter of claim 5, wherein the UMF signal is in the range of 902-960 MHz.

9. The RF transmitter of claim 1 further comprising:
A/D conversion means connected between the voice input and the multiplexer means comprising a voice amplifier and an A/D converter for converting the voice input to a digital signal.

10. The RF transmitter of claim 1, wherein the variable RF source means comprises:
channel frequency selector means for providing a selected channel frequency signal, and oscillator means connected to the output of the channel frequency selector means for converting the selected channel frequency signal to a digitally modulated sinusoidal signal.

11. The RF transmitter of claim 1, wherein the transmitter is transmitting in a digital paging system.

* * * * *